United States Patent
Borowski et al.

(10) Patent No.: US 6,963,602 B1
(45) Date of Patent: Nov. 8, 2005

(54) DIGITAL CORRECTION METHOD AND SYSTEM

(75) Inventors: Jörg Borowski, Dresden (DE); Klaus Meyer, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/477,164

(22) Filed: Jan. 5, 2000

(51) Int. Cl.[7] ............................ H04B 1/69; H04B 1/707
(52) U.S. Cl. ...................... 375/148; 375/149; 375/142; 375/150
(58) Field of Search ................................ 375/148, 149, 375/150, 147, 226, 326, 355; 370/203, 342, 370/346; 341/61; 708/290, 313

(56) References Cited

U.S. PATENT DOCUMENTS

| | | | |
|---|---|---|---|
| 4,468,784 A | * 8/1984 | Jagnow et al. | 375/150 |
| 5,361,276 A | * 11/1994 | Subramanian | 375/150 |
| 5,548,613 A | * 8/1996 | Kaku et al. | 375/150 |
| 5,579,338 A | * 11/1996 | Kojima | 375/149 |
| 5,764,630 A | 6/1998 | Natali et al. | 370/320 |
| 5,854,813 A | * 12/1998 | Rottinghaus et al. | 375/308 |
| 5,982,809 A | * 11/1999 | Liu et al. | 375/147 |
| 6,314,128 B1 | * 11/2001 | Bunker et al. | 375/149 |
| 6,621,857 B1 | * 9/2003 | Belotserkovsky et al. | 375/149 |

FOREIGN PATENT DOCUMENTS

WO   WO00/65797   11/2000

* cited by examiner

*Primary Examiner*—Young T. Tse
*Assistant Examiner*—Edith Chang
(74) *Attorney, Agent, or Firm*—Williams Morgan & Amerson, P.C.

(57) ABSTRACT

A method and system for providing a frequency correction for a spread spectrum communication receiver. In the method and system, a frequency offset is determined by processing successive samples of a despread data signal. A correction sequence is generated from this determined offset and combined with a code-spread received signal prior to despreading. A filter may be included in order to reduce noise in the system.

18 Claims, 3 Drawing Sheets

DIGITAL CORRECTION METHOD AND SYSTEM

BACKGROUND OF THE INVENTION

The present invention relates to a method and system for correcting an offset in a digital system. In particular, such a correction may be required in a digital communication system in which a frequency offset is present.

Digital communication systems are widely used for transmitting and receiving information. Examples of such digital communication systems include mobile telephone systems, for example the European GSM (Global System for Mobile Communications) system and the American D-AMPS system. Digital communication systems are also being developed for television transmissions.

Within the telecommunications community, there is a desire for a single telecommunication protocol to be introduced enabling the use of a single mobile telephone anywhere in the world. Whilst such a system is not yet in operation, it is apparent that the basis for such a system is likely to be one which uses a spread spectrum signal, in the form of a code division multiple access (CDMA) system.

In a CDMA system, a digital data signal is modulated by a second digital signal, the second signal generally having a significantly higher switching rate. Spread spectrum communication systems were originally developed for military and satellite applications but have since been developed for commercial mobile telephone applications. In the United States of America, the Telecommunications Industry Association has introduced the IS-95 CDMA standard for cellular telecommunications.

At a receiver, a radio receiver converts the received radio signal into an electrical signal. This is then mixed with an oscillator signal to recover the analog spread spectrum signal. An analog to digital converter samples the analog signal to obtain a digital signal, which may be an oversampled signal. This digital signal is despread by correlating the signal with the same pseudo-random code used in the generation of the digital spread spectrum signal to recreate the data signal.

In a CDMA communication system, there is a general requirement to perform automatic frequency correction at a receiver to take into account any systematic or instantaneous frequency variations, in particular transmit and receive oscillator frequency offsets. This is particularly the case in mobile systems, where the motion of the receiver with respect to the transmitter may result in a Doppler shift of the signal.

A variety of techniques have been employed in the prior art to provide automatic frequency correction in CDMA systems. One prior art technique is to perform frequency correction at the input to the receiver. In a CDMA receiver, the input to the receiver has the highest sampling rate and hence this solution demands a very high computational requirement. An alternative prior art solution is to perform frequency error detection and correction after the signal has been de-spread, at the symbol level. Such a solution is however severely limited in the range of frequency correction.

European patent application EP-A-0 762 666 describes a CDMA mobile communication system incorporating means for performing a phase error correction in which a transmitted pilot signal is despread and used to determine phase correction signals which are then fed back to a voltage controlled oscillator. In an alternative embodiment, frequency correction is performed by deriving phase correction signals from phase rotation changes of data with no use of pilot signals for frequency control.

SUMMARY OF THE INVENTION

The present invention provides a method of providing frequency correction for a spread spectrum communication receiver, said receiver being arranged to despread a code-spread signal having a first data rate to provide at least one despread data signal having a second, lower data rate, wherein said method comprises the steps of:
  i) determining a frequency offset by processing successive samples of said despread data signal;
  ii) generating a correction sequence from said determined frequency offset; and
  iii) combining said code-spread signal having said first data rate with said correction sequence obtained from said despread data signal having said second, lower data rate to correct the determined frequency offset.

By measuring a frequency offset at a relatively low signal data rate and combining a frequency correction with a data signal at a relatively higher rate, it is possible to reduce the amount of calculation required to determine the offset whilst allowing a relatively large range of frequency correction.

Preferably, the method includes a filtering step wherein any noise component in determined frequency offsets is reduced. This filtering may be performed by using a weighted average of previous measurements.

The determination of the frequency offset may be performed by calculating the mathematical argument of a complex sample of the despread data signal multiplied by the complex conjugate of the immediately preceding sample. The correction sequence may be combined with the code-spread signal including a frequency error by the multiplication of a complex correction factor therewith. In order to arrive at a correction factor for combination with the code-spread signal, a linear interpolation from the despread signal offset may be beneficially used.

In a further aspect of the invention, there is provided a spread spectrum communication system comprising a plurality of receivers for receiving transmitted signals, wherein each receiver comprises:
an RF signal receiver for generating an analog signal from a received RF signal;
an analog to digital converter for converting said analog signal into a digital signal;
a digital signal despreader for processing a code-spread signal having a first data rate to obtain a despread digital signal having a second data rate, said second data rate being lower than said first data rate; and
a frequency corrector,
wherein said frequency corrector comprises a feedback loop including a frequency offset detector for obtaining a measure of a frequency offset from said despread digital signal and a frequency correction generator for generating a frequency correction and a combiner for combining said frequency correction with said code-spread signal to correct said frequency offset.

In a still further aspect of the invention, there is provided a receiver for a spread spectrum communication system comprising:
an RF signal receiver for generating an analog signal from a received RF signal;
an analog to digital converter for converting said analog signal into a digital signal;
a digital signal despreader for processing a code-spread signal having a first data rate to obtain a despread digital signal having a second data rate, said second data rate being lower than said first data rate; and a frequency corrector, wherein said frequency corrector comprises a feedback loop including a frequency offset detector for obtaining a measure of a frequency offset from said despread digital signal and a frequency correction generator for generating a frequency correction and a combiner for combining said frequency correction with said code-spread signal to correct said frequency offset.

The spread spectrum communication system may be a code division multiple access system, and in particular a telephone communication system. In a mobile communication system, $T_x$ and $R_x$ oscillator frequency offsets and the relative movement of a transmitter and a receiver requires the necessity to perform frequency correction. Another example of a communication system in which the invention may be incorporated is a wireless local loop link.

BRIEF DESCRIPTION OF THE DRAWINGS

An embodiment of the present invention will now be described, by way of example only, with reference to the accompanying drawings in which.

DETAILED DESCRIPTION OF THE PREFERRED EMBODIMENT

Figure 1:
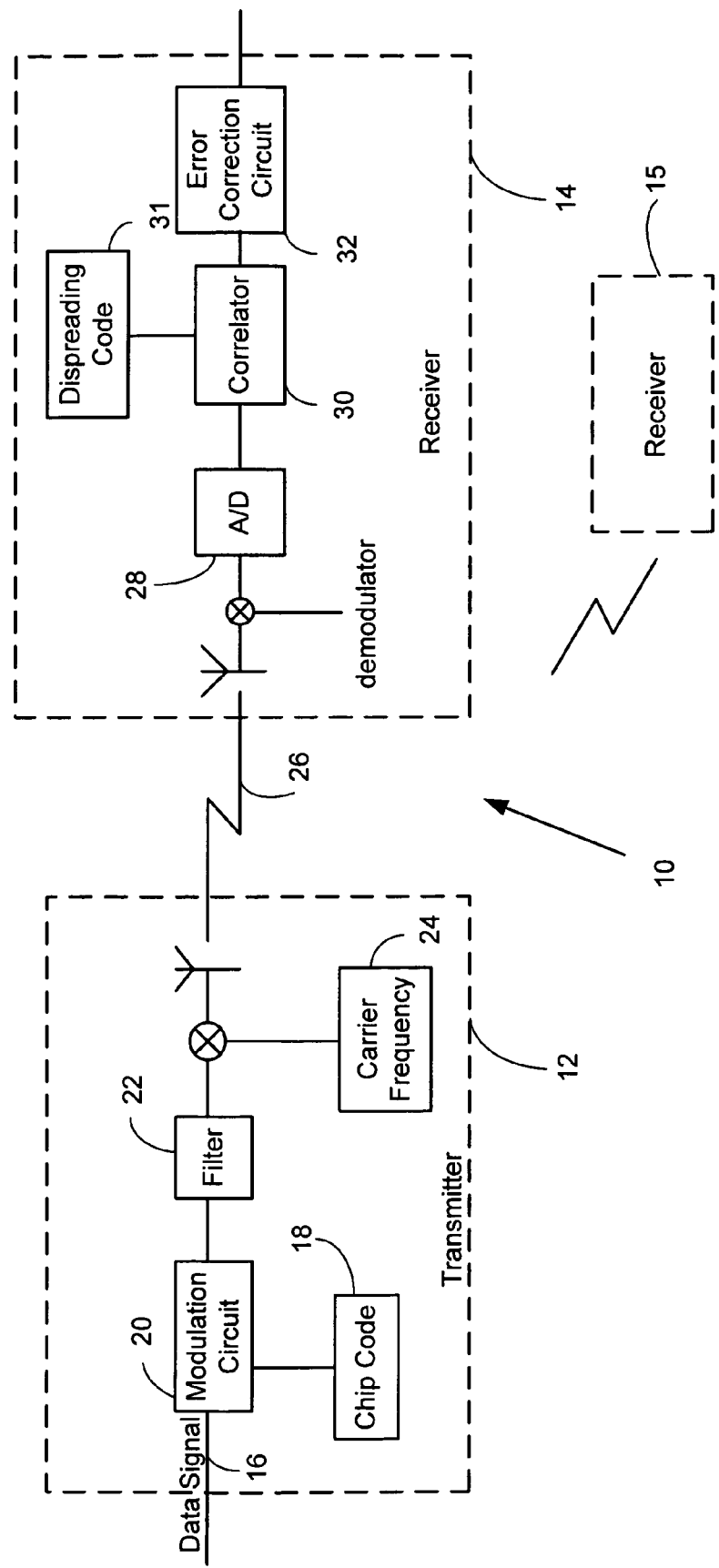
FIG. 1 shows a schematic diagram of a generalized CDMA communication system.

Referring now to FIG. 1, there is shown a CDMA communication system, indicated generally by 10. The communication system 10 comprises a transmitter 12 and one or more receivers 14, 15. Of course, for a two way communication system, each communication unit will have transmit and receive capabilities. In a CDMA mobile telephone system a base station will be capable of transmitting data to and receiving data from a plurality of remote units (such as receivers 14, 15) whilst each remote unit will receive messages from and transmit to, in general, only a single base station at any one time.

At the transmitter 12, a data signal to be transmitted 16, comprising a plurality of bits, is modulated by a chip code 18 in a modulation circuit 20. In the following, it is assumed that the data signal to be transmitted is transmitted according to a quaternary phase shift keying (QPSK) scheme, in which in-phase (I) and quadrature (Q) signals are modulated separately. The resulting digital spread spectrum signals are converted into an analog spread spectrum signal by a filter 22 and then mixed with a carrier frequency 24 before transmission over a channel 26.

At the receiver 14, a received RF signal has the carrier frequency removed and is then demodulated into I and Q signals. These are sampled and converted into digital signals by an analog to digital converter 28. These digital signals are despread by a correlator 30 in combination with a despreading code 31. Generally, the de-spreading code 31 is identical to the chip code 18. Following despreading the resulting data signals may be processed in an error correction circuit 32.

The data signal 16 has a data rate which is referred to as the symbol rate and which may typically be 128 kbit/s. The chip code 18 might typically have a data rate, known as the chip rate of 4096 chips/s. These two figures indicate a spreading factor of 32, this being the number of chips/bit.

Figure 2:
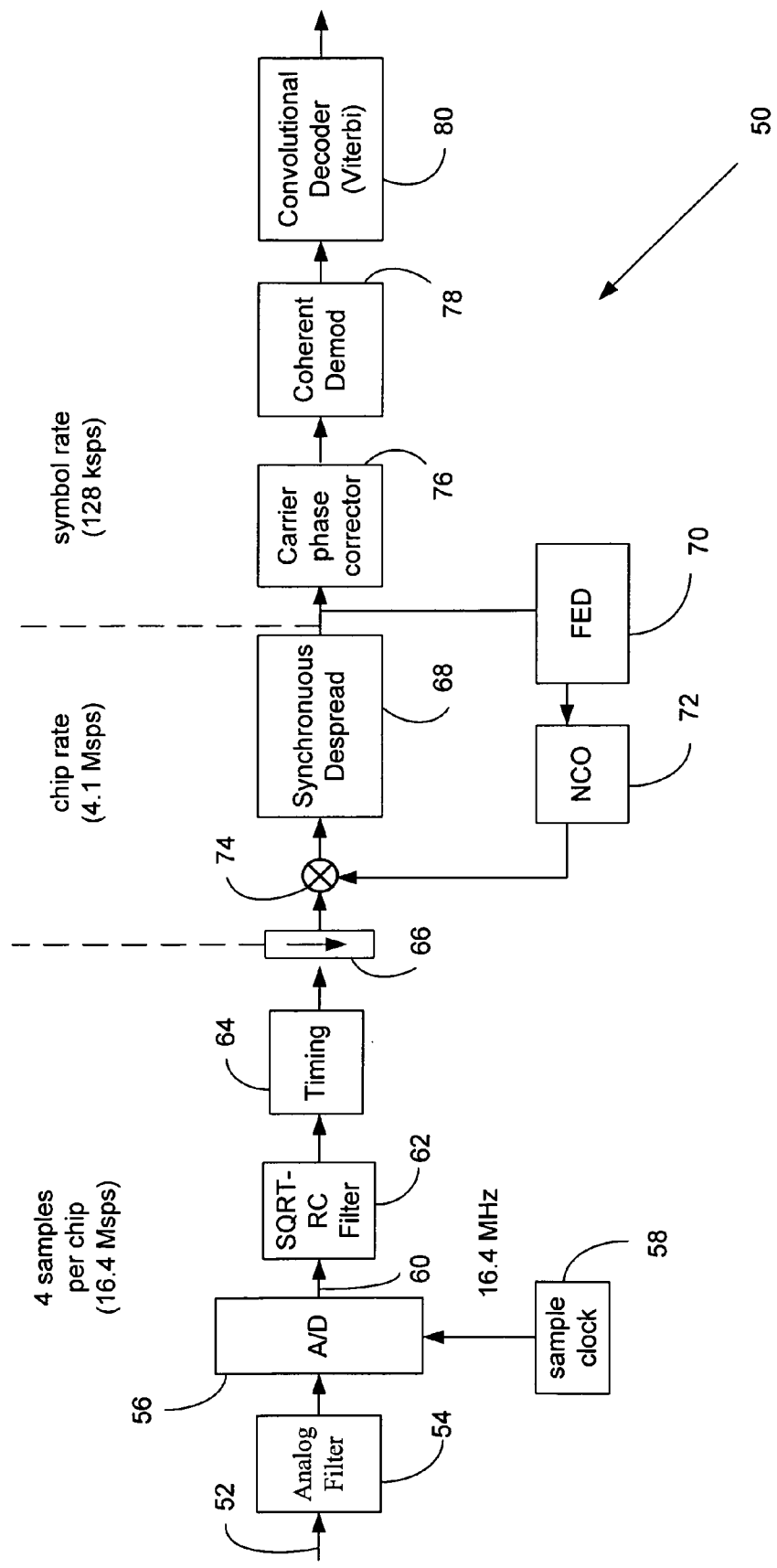
FIG. 2 shows a schematic representation of a CDMA communication system receiver incorporating frequency correction.

FIG. 2 shows a CDMA communication receiver 50 for incorporation in the system 10 having automatic frequency control which measures an offset at the symbol rate level and implements a frequency correction at the chip rate level. In the following description, it is assumed that quadrature demodulation was used for final down conversion of the analog signal. Hence, all operations in the signal processing chain have to be performed on both in-phase and quadrature components.

A data modulated and CDMA-code spread complex baseband signal 52 is passed through an analog filter 54 to an analog to digital converter 56. The analog to digital converter 56 receives a clock input from a clock 58 at a frequency which is four times that of the chip rate. The analog signal is thus sampled at a rate which is four times the chip rate, or 16.4 Msamples/s. The resulting oversampled signal 60 passes through a conventional noise and pulse shaping square root raised cosine complex filter 62. Timing correction is performed by a timing circuitry 64. The resulting data stream is thereby synchronized with respect to frame, symbol and chip time at more thank the chip rate. The next stage is for the data stream to be down-converted by a down-converter 66 to the chip rate to provide one complex sample pair per chip, taken at the optimum sampling instant.

The above standard signal processing operations. After down converting to the chip rate, the data streams is passed to a despreading stage which includes the automatic frequency control of the invention. After time alignment, the resulting time-aligned complex samples $Z_{chip,offs}(k)$ before frequency correction have a frequency offset $f_{offs}$ to be corrected. This correction is performed by multiplying $Z_{chip,offs}(k)$ by the complex conjugate of a determined correction envelope $Z_{offs}(k)$.

Despreading is performed by a despreader 68. In the despreader 68, two parallel code-length tap FIR-structure matched filters (not shown) are employed, one for each of the in-phase and quadrature branches. The same real valued CDMA-code vector is applied as filter coefficients to both the in-phase and quadrature branch. Since timing is known, multiply and add operations are executed at the known symbol sampling instants only, i.e. once per symbol for every tap. As a result of the complex correlation despreading operation performed by the despreader 68, a data stream $Z_{sym}(n)$ at the symbol rate is obtained.

Frequency error detection is performed by a detector 70. The detector determines a frequency error and feeds this value to a numerically controlled oscillator 72 which produces a offset correction which is multiplied with the samples to be corrected by a multiplier 74.

After despreading, the resultant symbol stream is passed to a carrier phase corrector 76 and thence a coherent demodulator 78. Error correction is provided by a Viterbi convolutional decoder 80. Where appropriate, the resulting processed signal is then processed to arrange the information into individual channels and if these correspond to a voice transmission they may be converted into an analog voice signal.

Figure 3:
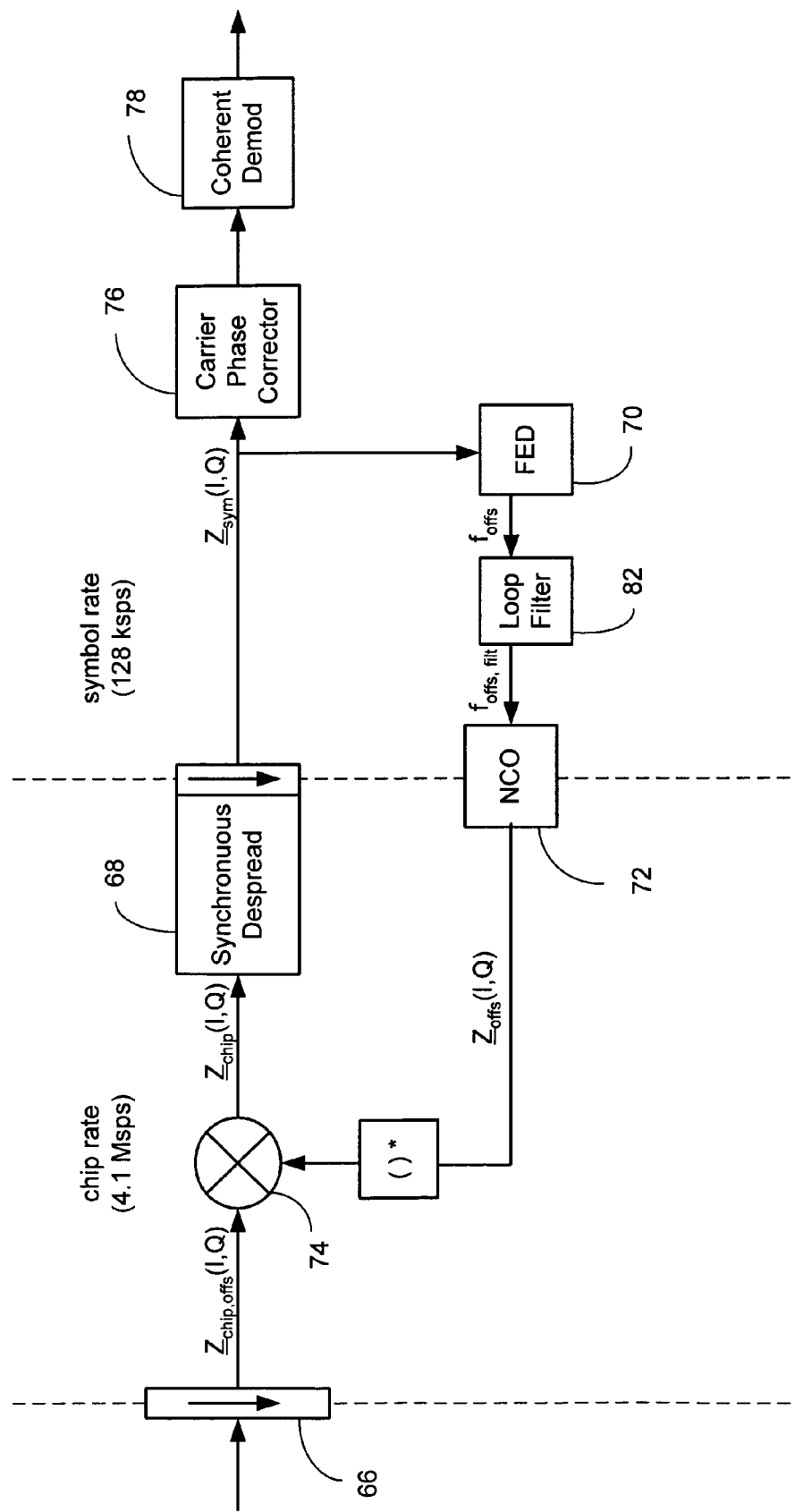
FIG. 3 shows the FIG. 2 frequency correction arrangement in greater detail.

Referring now to FIG. 3, the automatic frequency correction stage of the receiver 50 is shown in greater detail.

At a sampling instant, n, the symbol samples may be expressed by the following equation $$Z_{sym}(n) = A(n) \cdot \exp\{j[\phi_{mod}(n) + \phi_{offs}(n) + \phi_{noise}(n) + \phi_o(n)]\}$$

At each sampling instant n, the symbol samples contain information concerning a modulation phase shift $\phi_{mod}(n)$ and the oscillator frequency offset through a linearly changing phase offset $\phi_{offs}(n)$. These phase shifts are distorted by a noise component which is randomly changing $\phi_{noise}(n)$ and there is also a constant initial phase value $\phi_0(n)$.

The frequency error detector 70 determines $f_{offs}(n)$ from incoming complex signal samples $Z_{sym}(n)$ using the phase difference $\phi_{offs}(n)-\phi_{offs}(n-1)$ between two consecutive symbol samples $Z_{sym}(n)$ and $Z_{sym}(n-1)$. The frequency offset $f_{offs}(n)$ is obtained by performing the following complex multiplication and argument operation:

$$\phi_{offs}(n)-\phi_{offs}(n-1)+\Delta\phi_{mod}(n)+\Delta\phi_{noise}(n)=\arg\ \{Z_{sym}(n)\cdot Z_{sym}^*(n-1)\}$$

where ( )* denotes a complex conjugate operation.

The differential modulation phase $\Delta\phi_{mod}(n)$ contains one out of a set of m known values and is removed by rotating the constellation point around zero origin so that the resulting vector has an angle value less than half the smallest differential modulation phase. For (D)QPSK modulation this results in $$\Delta\varphi_{offs}(n) + \Delta\varphi_{noise}(n) = \varphi_{offs}(n) - \varphi_{offs}(n-1) + \Delta\varphi_{noise}(n)$$
$$= [\varphi_{offs}(n) - \varphi_{offs}(n-1) + \Delta\varphi_{mod}(n) + \Delta\varphi_{noise}(n)] \text{modulo} \frac{\pi}{2}$$

with the resulting phase difference falling into the interval $-\pi/4 \leq \Delta\phi_{offs}+\Delta\phi_{nosie} < \pi/4$ so that a frequency offset $$f_{offs}(n) + f_{noise}(n) = \frac{\Delta\varphi_{offs}(n) + \Delta\varphi_{noise}(n)}{T_{sym}}$$

can be captured in the range $$-\frac{\pi}{4\,T_{sym}} \leq f_{offs} + f_{noise} < \frac{\pi}{4\,T_{sym}}$$

with $T_{sym}$ being the symbol duration, equal to the codelength times the chip duration.

After the frequency offsets have been determined, a second order lowpass filter 82 is used to reduce noise by averaging consecutive frequency offset estimates. The filter 82 performs the following operation:

$$f_{offs,filt}(n) = c_1 \cdot [f_{offs}(n) + f_{noise}(n)] +$$
$$c_2 \cdot [f_{offs}(n-1) + f_{noise}(n-1) + f_{offs}(n-2) + f_{noise}(n-2) + \ldots]$$

The filter coefficients $c_1$ and $c_2$ determine the noise filter bandwidth above which the spectral noise components are suppressed.

One filtered frequency offset estimate $f_{offs,filt}(n)$ per symbol duration $T_{sym}$ is provided to the numerically controlled oscillator 72 indicating the average phase change of the complex data stream $Z_{chip,offs}(k)$ between the first and the last sample of a symbol caused by oscillator frequency offset. The oscillator 72 generates an up-sampled complex correction sequence $$Z_{offs}(k)=1\cdot\exp\ \{j\phi_{offs}(k)\}$$

where the chip rate phase values $\phi_{offs}(k)$ are linearly interpolated from the average phase differences per symbol duration $\Delta\phi_{offs,filt}(n)=T_{sym}\cdot f_{offs,filt}(n)$.

To close the feedback loop, the multiplier 74 performs a complex multiplication, multiplying the incoming erroneous samples $Z_{chip,offs}(k)$ by the complex conjugate of the constructed correction envelope $Z_{offs}(k)$ $$Z_{chip}(k)=Z_{chip,offs}(k)\cdot Z_{offs}^*(k)$$

Initially, a frequency offset will not have been detected and hence the multiplication factor $Z_{offs}(k)$ at all chip sampling instances k in the first symbol is set to (1+j0) and $Z_{chip}(k)$ is equal to $Z_{chip,offs}(k)$.

The above frequency correction system does not require the presence of an extra pilot signal for providing the desired oscillator frequency offset estimation and correction. Frequency offset estimation is performed using energy in the modulated and spread data symbols only. In principle, however, such an arrangement could be applied to a pilot signal system.

It will be further understood by those skilled in the art that the foregoing description pertains to a preferred embodiment of the disclosed system and that various changes and modifications may be made in the invention without departing from the spirit and scope thereof.

We claim:

1. A method of providing frequency correction for a spread spectrum communication receiver, comprising the steps of:
   receiving a first signal having a first data rate, wherein the first signal is a digital signal;
   determining, based at least on the first signal, a second signal having a second data rate, wherein the second data rate is lower than the first data rate;
   determining, based at least on the second signal, a third signal having a third data rate, wherein the third data rate is lower than the second data rate;
   determining a frequency offset by processing samples of said third signal;
   generating a correction sequence from said determined frequency offset; and
   combining said second signal having said second data rate with said correction sequence obtained from said third signal having third data rate to correct the determined frequency offset.

2. The method of claim 1 further comprising the step of filtering the determined frequency offset prior to the generation of the correction sequence therefrom to reduce noise therein.

3. The method of claim 1 wherein said step of determining the frequency offset includes the performance of a data processing operation comprising the calculation of the mathematical argument of a complex sample multiplied by the complex conjugate of a preceding complex sample.

4. The method of claim 1 wherein the communication receiver is a code division multiple access communication receiver and wherein the frequency offset is determined from consecutive symbol samples and the frequency offset is corrected by multiplying received data by a correction factor.

5. The method of claim 1 wherein said correction sequence is an up-sampled complex correction sequence $Z_{offs}(k)$, where k represents a given sampling instant, where $Z_{offs}(k)$ is equal to $1 \times \exp\{j\phi_{offs}(k)\}$ where $\phi_{offs}(k)$ represents phase offset values at the first data rate which are linearly interpolated from an average phase difference at the third data rate.

6. A spread spectrum communication system comprising a plurality of receivers for receiving transmitted signals, wherein each receiver comprises:
   an RF signal receiver for generating an analog signal from a received RF signal;
   an analog to digital converter for converting said analog signal into a digital signal, the digital signal having a first data rate;
   a downconverter for downconverting the digital signal to a second signal having a second data rate, wherein the second data rate is lower than the first data rate;
   a digital signal despreader for processing the second signal having the second data rate to obtain a despread digital signal having a third data rate, said third data rate being lower than said second data rate; and
   a frequency corrector,
   wherein said frequency corrector comprises a feedback loop including a frequency offset detector for obtaining a measure of a frequency offset from said despread digital signal and a frequency correction generator for generating a frequency correction and a combiner for combining said frequency correction with said second signal to correct said frequency offset.

7. The spread spectrum communication system according to claim 6 wherein said feedback loop includes a filter for filtering said measure of said frequency offset to reduce noise therein.

8. The spread spectrum communication system according to claim 6 wherein said frequency offset detector is adapted to perform a mathematical operation of determining the mathematical argument of a complex sample of said despread digital signal multiplied by the complex conjugate of an immediately preceding sample of said despread digital signal.

9. The spread spectrum communication system according to claim 6 wherein said frequency corrector includes a multiplier for multiplying said second signal by a correction factor prior to despreading said digital signal.

10. The spread spectrum communication system according to claim 6 wherein said frequency correction generator comprises an interpolator for calculating phase offset values for said second digital signal from an average phase difference calculated from samples of said despread digital signal.

11. The spread spectrum communication system according to claim 6 is a code division multiple access system.

12. The spread spectrum communication system according to claim 6 is a wireless local loop link.

13. The spread spectrum communications system of claim 6, further comprising a timing circuitry communicatively coupled between the analog to digital converter and the down-converter to perform a timing correction function.

14. The spread spectrum communications system of claim 6, wherein said frequency correction is an up-sampled complex correction sequence $Z_{offs}(k)$, where k represents a given sampling instant, and where $Z_{offs}(k)$ is equal to $1 \times \exp\{j\phi_{offs}(k)\}$ where $\phi_{offs}(k)$ represents phase offset values at the first data rate which are linearly interpolated from an average phase difference at the third data rate.

15. The spread spectrum communications system of claim 6, wherein the RF signal receiver for generating the analog signal comprises the RF signal receiver providing the analog signal to the analog-to-digital converter.

16. A receiver for a spread spectrum communication system comprising:
   an analog to digital converter for converting an analog signal into a digital signal having a first data rate;
   a downconverter for downconverting the digital signal to a second signal having a second data rate, wherein the second data rate is lower than the first data rate;
   a digital signal despreader for processing the second signal having the second data rate to obtain a despread digital signal having a third data rate, said third data rate being lower than said second data rate; and
   a frequency corrector,
   wherein said frequency corrector comprises a feedback loop including a frequency offset detector for obtaining a measure of a frequency offset from said despread digital signal and a frequency correction generator for generating a frequency correction and a combiner for combining said frequency correction with said second signal to correct said frequency offset.

17. The receiver of claim 16, further comprising a timing circuitry communicatively coupled between the analog to digital converter and the down-converter to perform a timing correction function.

18. The receiver of claim 16, wherein said frequency correction is an up-sampled complex correction sequence $Z_{offs}(k)$, where k represents a given sampling instant, and where $Z_{offs}(k)$ is equal to $1 \times \exp\{j\phi_{offs}(k)\}$ where $\phi_{offs}(k)$ represents phase offset values at the first data rate which are linearly interpolated from an average phase difference at the third data rate.

* * * * *